United States Patent [19]

Stevens

[11] Patent Number: 5,856,792
[45] Date of Patent: *Jan. 5, 1999

[54] INTERRUPT DRIVEN METHOD OF REMOTE CONTROL

[75] Inventor: Sean Stevens, Pompano Beach, Fla.

[73] Assignee: Sony Corporation of America, Park Ridge, N.J.

[*] Notice: The terminal 8 months of this patent has been disclaimed.

[21] Appl. No.: 840,113

[22] Filed: Feb. 24, 1992

[51] Int. Cl.$^6$ .................................................. G08C 19/00
[52] U.S. Cl. .................... 340/870.43; 381/105; 381/109; 381/119; 338/334
[58] Field of Search .................. 340/870.43, 870.16; 361/188; 364/571.04; 381/104, 109, 119, 105; 338/128, 334

[56] References Cited

U.S. PATENT DOCUMENTS

| | | | |
|---|---|---|---|
| 4,010,423 | 3/1977 | Collins et al. | 455/355 |
| 4,129,886 | 12/1978 | Shih | 455/151.2 |
| 4,349,779 | 9/1982 | Ono | 381/104 |
| 4,550,400 | 10/1985 | Henderson, Jr. et al. | 370/85.1 |
| 4,715,051 | 12/1987 | Giardina | 377/45 |
| 4,879,751 | 11/1989 | Franks et al. | 381/119 |
| 4,885,792 | 12/1989 | Christensen et al. | 381/119 |
| 4,930,041 | 5/1990 | Elderton et al. | 340/870.16 |
| 4,933,575 | 6/1990 | Aso | 307/465 |
| 5,054,077 | 10/1991 | Suzuki | 381/109 |
| 5,134,576 | 7/1992 | Jackson et al. | 364/571.05 |
| 5,189,705 | 2/1993 | Lavaud | 381/109 |
| 5,247,680 | 9/1993 | Huber | 395/800 |
| 5,303,371 | 4/1994 | Nakajima | 381/109 |
| 5,317,558 | 5/1994 | Yagami et al. | 381/105 |

*Primary Examiner*—Thomas Mullen
*Assistant Examiner*—Andrew Hill
*Attorney, Agent, or Firm*—Ronald P. Kananen

[57] ABSTRACT

An interrupt apparatus for remotely controlling a potentiometer is comprised of an encoder for generating a pair of quadrature output signals whenever the encoder becomes rotated. The pair of signals are sent to a pair of D flip-flops for detecting a rising or falling edge of one of the signals. The pair of D flip-flops sends an interrupt signal to a microprocessor when the signals indicate that the encoder has been rotated. Either one of a pair of AND gates will output a high signal to set a third D flip-flop when motion is in the counter-clockwise direction. After being interrupted, the microprocessor reads the direction signal from the third flip-flop, resets the three flip-flops so that subsequent motion may be detected, updates the value of resistance stored in memory, and outputs the magnitude of the resistance in digital form. The digital signal is converted into an analog signal and received at a servo control circuit for causing the motorized potentiometer to become repositioned to the desired resistance.

5 Claims, 4 Drawing Sheets

INTERRUPT DRIVEN METHOD OF REMOTE CONTROL

BACKGROUND OF INVENTION

1. Field of the Invention

This invention relates generally to a method of remote control and, more particularly, to an interrupt method of remotely controlling the setting of a device, such as a potentiometer in the feedback loop of a preamplifier in an audio mixer.

2. Description of Prior Art

An audio mixer is typically connected to a plurality of microphones and/or other input lines. The microphones and other input lines frequently have a pre-amplifier stage for amplifying the signals before they reach the mixing stages. The pre-amplifiers are generally configured with a potentiometer so that an operator may manually vary the amount of feedback in the pre-amplifier and thus vary the amount of amplification, as is well known in the art.

It is difficult, however, to easily and accurately set the value of the potentiometer to a desired setting, as discussed in U.S. Pat. No. 4,677,674 to Snyder, for example. Snyder discloses a system in which the setting of a fader potentiometer may be reset by the use of test signals and by manually adjusting the potentiometer until the previous setting is reached.

The use of a control system for remotely controlling the setting of a potentiometer is also known. For instance, U.S. Pat. No. 3,831,075 issued to Liska et al. discloses a servo control circuit which has feedback to insure that the desired setting of the potentiometer equals the actual setting of the potentiometer. In this system, an amplifier receives the difference between the actual and desired settings. Depending upon whether this difference is positive or negative, the motor is driven either one or the other directions in order to reposition the potentiometer.

Also, U.S. Pat. No. 4,715,051 issued to Giardina discloses an arrangement which can remotely control the setting of an electronic "potentiometer" having a variable resistance. The arrangement comprises an operator controlled switch which is toggled for causing a counter to either increase or decrease its count. A digital to analog converter receives the output of the counter and transmits an analog signal to a pair of complementary opto-isolators to simulate the effect of a potentiometer. This arrangement replaces the potentiometer with the pair of opto-isolators.

It is a problem in the prior art to remotely control the gain of a pre-amplifier for use with an audio mixer. It is also a problem in the prior art to repeatedly set the value of the potentiometer to a desired value. It is also a problem in the prior art to accurately set the value of a potentiometer.

SUMMARY OF THE INVENTION

It is an object of the present invention to provide an apparatus and method of remote control which can accurately set the value of a potentiometer remotely.

It is another object of the present invention to provide an apparatus and method of remote control which can quickly and easily determine the magnitude and direction of change in a potentiometer's desired setting.

It is yet another object of the present invention to provide an apparatus and method of remote control which can repeatedly, accurately, and remotely set the value of a potentiometer.

It is a further object of the present invention to provide an apparatus and method of remote control which can remotely vary the gain of a pre-amplifier in an audio mixer.

It is yet a further object of the present invention to provide an apparatus and method of remote control which can automatically set the initial value of a potentiometer.

Additional objects, advantages and novel features of the invention will be set forth in the description which follows, and will become apparent to those skilled in the art upon reading this description or practicing the invention. The objects and advantages of the invention may be realized and attained by the appended claims.

To achieve the foregoing and other objects, in accordance with the present invention, as embodied and broadly described herein, the apparatus and method of remote control comprises an encoder that produces output signals whenever the encoder is manually rotated. The output signals are provided to a logic section for decoding the output signals and for producing a microprocessor interrupt signal upon rotation. The logic section also informs the microprocessor of the direction in which the encoder had been rotated. The microprocessor reads the direction signal, resets the logic section, updates the value of resistance stored in memory, and outputs a signal representing the desired value of resistance for the potentiometer. The desired resistance signal is received at a control circuit which repositions the potentiometer to reflect the updated value of resistance.

BRIEF DESCRIPTION OF THE DRAWINGS

The accompanying drawings, which are incorporated in, and form a part of, the specification, illustrate an embodiment of the present invention and, together with the description, serve to explain the principles of the invention. In the drawings.

DETAILED DESCRIPTION OF THE PREFERRED EMBODIMENT

Reference will now be made in detail to the preferred embodiment of the invention, an example of which is illustrated in the accompanying drawings.

Figure 1:
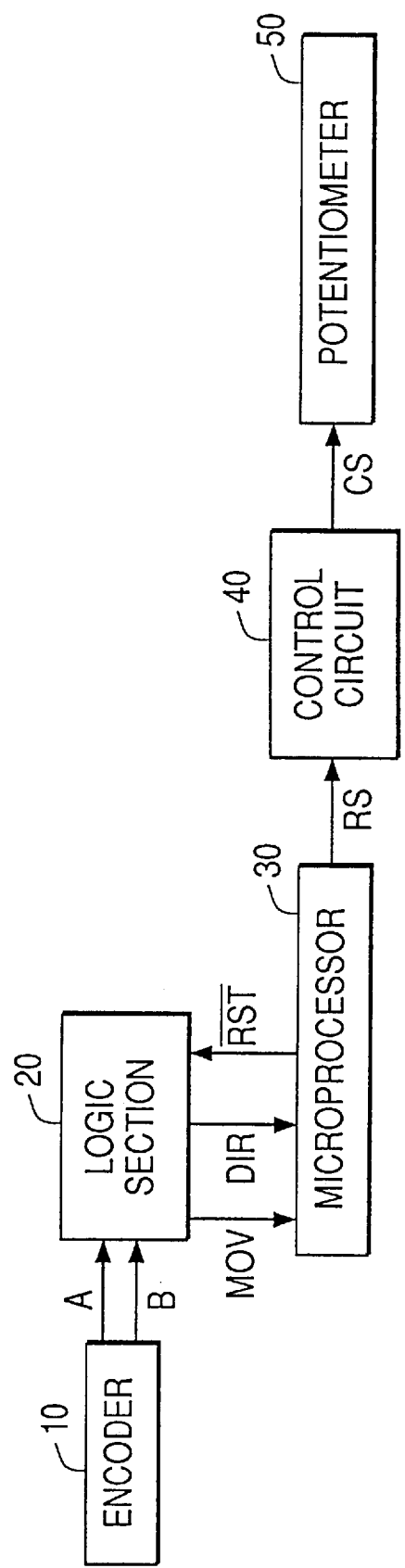
FIG. 1 illustrates a schematic of the remote control apparatus.

Referring to FIG. 1, an encoder 10 is an adjustable device which generates a plurality of output signals, e.g., signals A and B, when the encoder 10 is adjusted. Preferably, for example, the encoder 10 may be a Series 600 optical rotary encoder manufactured by Clarostat. This encoder 10 outputs two square waves with a 90° phase difference and outputs 128 pulses per channel per revolution. For each incremental rotational change in the encoder 10, the encoder 10 produces a pulse on each of its signal lines A and B. The direction of rotation may be determined according to the phase relationship between the pulses on the two signal lines A and B. The positioning of the encoder 10 determines the setting of a potentiometer 50.

The signals A and B are received as inputs in a logic section 20, which decodes the signals A and B and sends at least one control signal, e.g., signal MOV to a microprocessor 30 when the logic section 20 has determined that the encoder 10 has been rotated. The control signal MOV interrupts the microprocessor 30 which then reads a second control signal, e.g., a direction signal DIR which is also determined by the logic section 20. The DIR signal is received at one of the inputs of the microprocessor 30 for enabling it to determine the direction of rotation of the encoder 10.

The microprocessor has stored in a memory, preferably, for example, in a static RAM, a value of resistance which is the desired setting of the potentiometer 50. According to the determined direction of rotation, the microprocessor 30 either increments or decrements the value of the resistance stored in memory. The microprocessor 30 then resets the logic section 20 by providing a reset signal $\overline{RST}$ to the logic section 20. The microprocessor 30 also outputs a signal RS representing the desired value of resistance. The desired resistance signal RS is received at a control circuit 40 which generates a control signal CS for positioning a device, e.g., a motorized potentiometer 50 in accordance with the desired setting.

The initial value for the resistance of the motorized potentiometer 50 is stored in the microprocessor's static RAM. During a power-up sequence, the microprocessor 30 reads this initial value and outputs the desired resistance signal RS to the control circuit 40 which then outputs the control signal CS for setting the potentiometer's initial setting.

Thus, when the encoder 10 is rotated, either manually or otherwise thereby indicating a change in resistance, the microprocessor 30 receives signals from the logic section 20 indicating the magnitude and direction of the resistance change. The microprocessor 30 then updates the value of the resistance stored in memory to reflect the change and generates a new desired resistance signal RS accordingly.

Figure 2A:
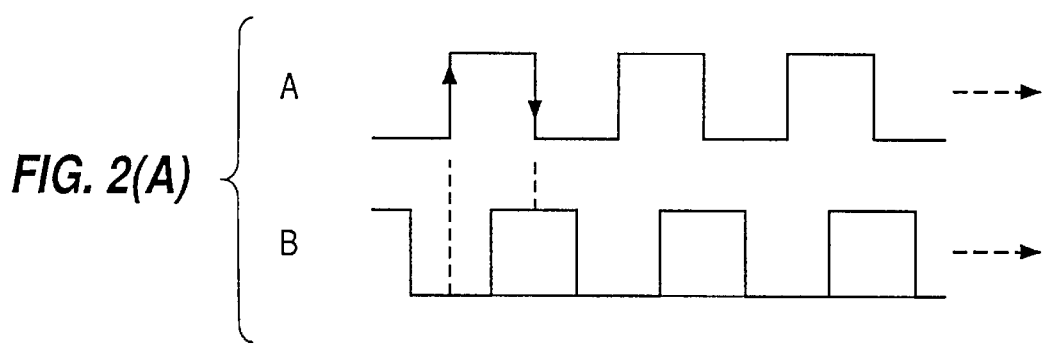
FIGS. 2(A) and 2(B) illustrate encoder signals for counter-clockwise rotation and clockwise rotation respectively.
Figure 2B:
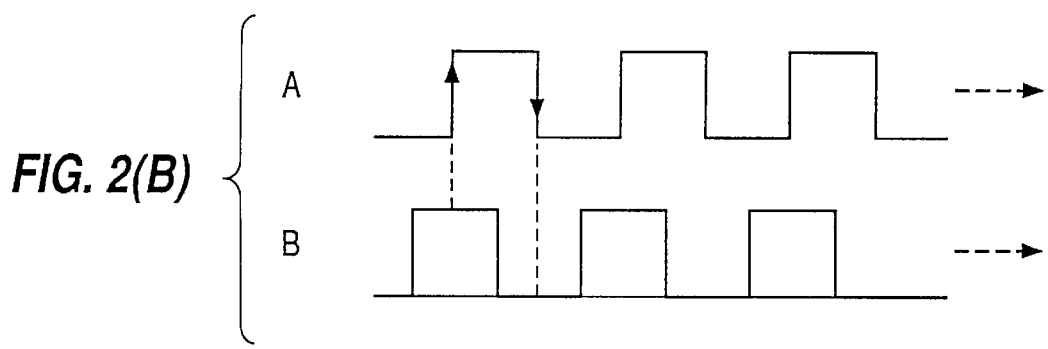

FIG. 2(A) illustrates the state of signals A and B with counter-clockwise rotation of the encoder 10. When the motion is in a counter-clockwise direction, signal B is at a low level at the time signal A rises to its high level. As shown in FIG. 2(B), when the motion is clockwise, signal B is at its high level when signal A rises to its high level.

Figure 3:
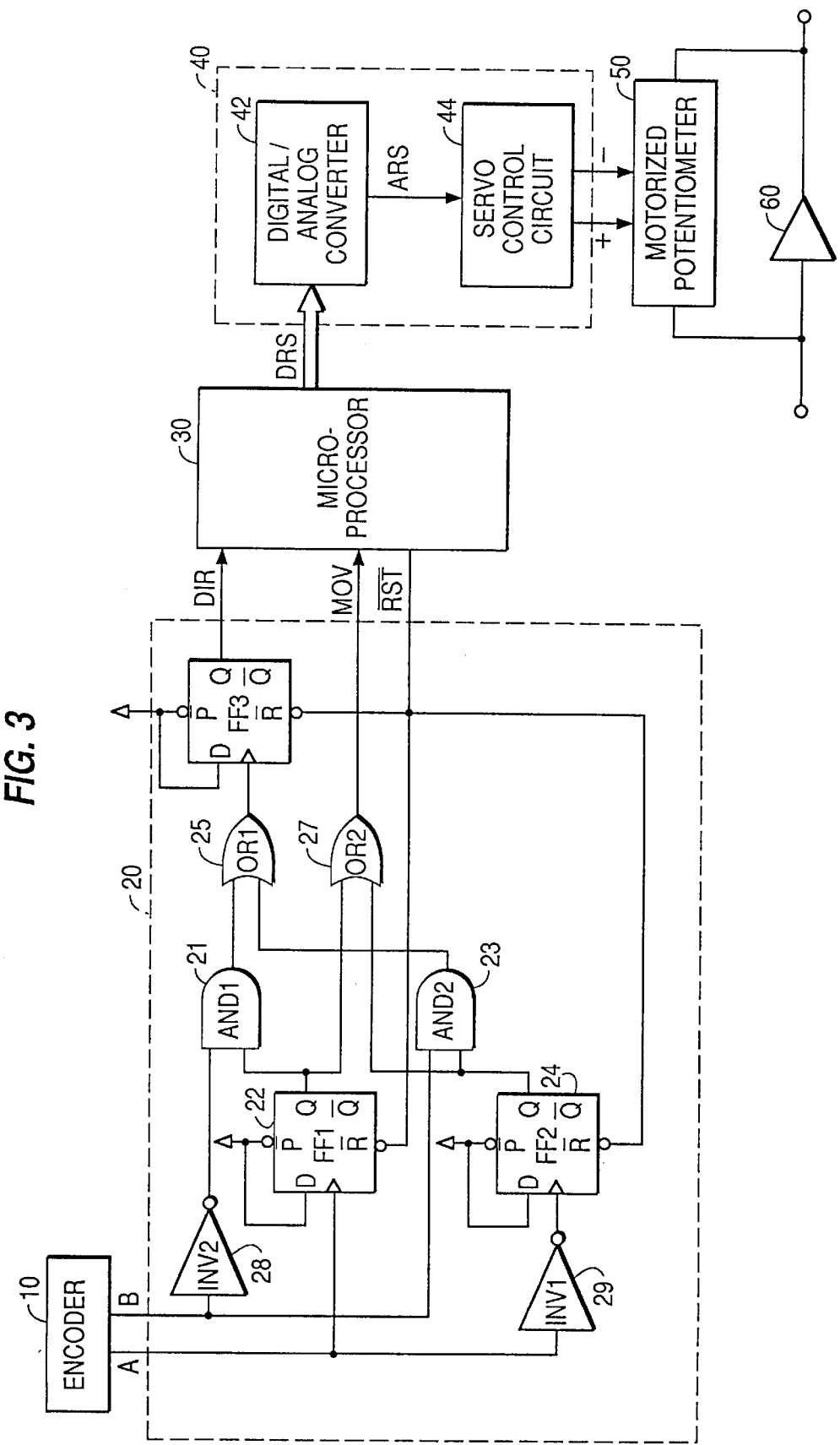
FIG. 3 illustrates an embodiment of the circuitry for the remote control apparatus.

FIG. 3 illustrates an embodiment of the circuitry for the remote control apparatus. In the logic section 20, signal A is provided to the clock input of D flip-flop 22 and also to the clock input of D flip-flop 24 through an inverter 29. The D inputs of both D flip-flops 22 and 24 are held high together with the preset inputs $\overline{P}$. Also, the reset inputs $\overline{R}$ of both D flip-flops 22 and 24 are connected to the microprocessor's $\overline{RST}$ output.

With a rising edge of signal A, D flip-flop 22 provides a Q output which is high. With a falling edge of signal A, D flip-flop 24 provides a Q output which is high. The Q outputs of both flip-flops 22 and 24 are sent to the two inputs of an OR gate 27. The output of OR gate 27 is an MOV input to the microprocessor 30. Thus, if signal A encounters a rising or falling edge, D flip-flop 22 or 24 will generate a high Q output, respectively. Since the falling or rising edge of signal A indicates movement of the encoder 10, a high Q output from either of the D flip-flops 22 or 24 will generate a high signal at the microprocessor's MOV input.

An AND gate 21 receives the Q output from D flip-flop 22 and the output of an inverter 28, which is signal B inverted. Both inputs to the AND gate 21 will be high, and will thus produce a high signal at the output of AND gate 21, when signal B is at a low value at the time signal A encounters a rising edge. Since the states of signals A and B indicate encoder 10 motion in the counter-clockwise direction, AND gate 21 will output a high signal during counter-clockwise rotation and signal A's rising edge.

Another AND gate 23 receives the Q output from D flip-flop 24 at one of its inputs and signal B at the other input. AND gate 23 will produce a high output when signal B is at a high level at the time signal A encounters a falling edge. Since these states of signals A and B also indicate counter-clockwise rotation, AND gate 23 will generate a high output during counter-clockwise rotation and signal A's falling edge.

The outputs of AND gates 21 and 23 are the two inputs to an OR gate 25. Because AND gate 21 generates a high output during signal A's rising edge and AND gate 23 generates a high output during signal A's falling edge, one of the two AND gates 21 or 23 will produce a high output during counter-clockwise rotation, regardless of the specific states of signals A and B. Therefore, during counter-clockwise rotation, the output of OR gate 25 will be high.

A D flip-flop 26 receives the output of OR gate 25 as its clock input. The D input and preset input $\overline{P}$ of flip-flop 26 are held high. As with D flip-flops 22 and 24, the reset input $\overline{R}$ to flip-flop 26 is connected to the $\overline{RST}$ output of the microprocessor 30. The Q output of D flip-flop 26 is sent to the DIR input to the microprocessor 30. Thus, during counter-clockwise rotation, the clock input to D flip-flop 26 will be high which will produce a high Q output. A high signal at the DIR input informs the microprocessor 30 that the encoder 10 has been rotated in a counter-clockwise direction.

After being interrupted and after reading the direction of rotation signal DIR, the microprocessor 30 resets the flip-flops 22, 24, and 26 by generating a low $\overline{RST}$ signal. The microprocessor 30 also increments or decrements the value of the resistance stored in memory and the value of a digital resistance signal DRS. The digital resistance signal DRS represents digitally the desired resistance of the potentiometer 50. A digital to analog converter 42 receives the digital resistance signal DRS and outputs an analog equivalent ARS of the digital signal. The servo control circuit 44 receives the analog resistance signal ARS and repositions the motorized potentiometer 50 in accordance with the desired setting. As shown in FIG. 3, the motorized potentiometer is preferably, for example, in the feedback loop of a preamplifier 60 in an audio mixer.

Figure 4:
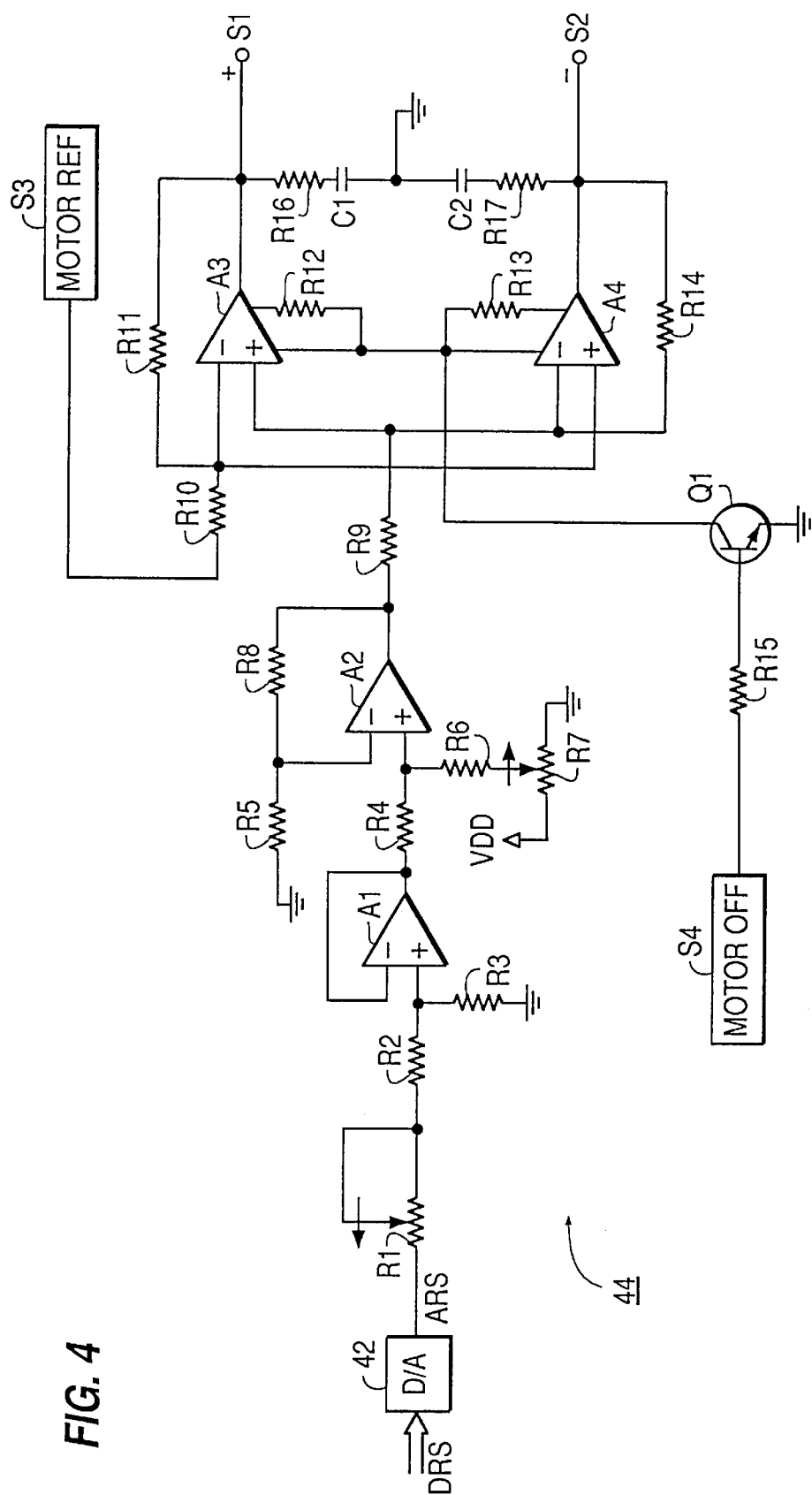
FIG. 4 illustrates an embodiment of the control circuit for driving the motorized potentiometer.

FIG. 4 illustrates an embodiment of the control circuit 40. The digital to analog converter 42 receives the digital resistance signal DRS and outputs the analog resistance signal ARS. The analog resistance signal ARS, preferably, for example, varies between 0 to 5 volts. The analog resistance signal ARS is buffered, level adjusted, amplified, and then sent to the non-inverting input of op-amp A3 and to the inverting input of op-amp A4. A motor reference voltage S3 is supplied to the inverting input of op-amp A3 and to the non-inverting input of op-amp A4. When the potentiometer 50 becomes repositioned, the voltage of the motor reference level S3 changes to reflect the motor's updated position. Thus, the potentiometer's resistance becomes adjusted until the voltage of the motor reference level S3 equals the voltages at the non-inverting input of op-amp A3 and the voltage at the inverting input of op-amp A4.

In summary, the encoder 10 will generate a pulse on each of signal lines A and B whenever the encoder 10 has been rotated an incremental amount. The logic section 20 will generate a high MOV input to inform the microprocessor 30 that motion has occurred. The microprocessor 30 will be interrupted and will then read its DIR input to determine the direction of rotation. If signal DIR is high, then the microprocessor 30 determines that rotation has occurred in a counter-clockwise direction, which, for example, indicates a decrease in the resistance setting. When the DIR signal is low, rotation has occurred in a clockwise direction, which, for example, would then indicate an increase in the resistance setting.

After the microprocessor 30 determines the direction of rotation, the microprocessor 30 outputs a low level on its RST output in order to reset D flip-flops 22, 24, and 26. The logic section 20 is then reset and the circuitry is ready to inform the microprocessor 30 of any subsequent motion. The microprocessor 30 also increments or decrements the value of the resistance stored in memory to reflect the change. The corresponding digital value DRS for the resistance is outputted by the microprocessor 30 and received at the digital to analog converter 42. The servo control circuit 44 receives the equivalent analog value ARS of the resistance and repositions the potentiometer 50 through a motor so that the potentiometer 50 is set to the updated value of resistance. The resistance change is thereby translated into a change in gain by placing the motorized potentiometer in the feedback loop of a preamplifier 60.

The foregoing description of a preferred embodiment of the invention has been presented for purposes of illustration and description. It is not intended to be exhaustive or to limit the invention to the precise form disclosed. Many modifications and variations are possible in light of the above teaching. For example, although the logic circuitry 20 may be used with the remote control of a motorized potentiometer 50 in an audio digital mixer, other uses are possible. Also, any suitable control circuit 40 may be used to effect the positioning of the motor. Additionally, although the motorized potentiometer 50 may be placed in the feedback loop of a preamplifier 60, potentiometers found in other places in an audio mixer, or elsewhere, may be similarly controlled.

The embodiment was chosen and described in order to best explain the principles of the invention and its practical application to thereby enable others skilled in the art to best utilize the invention and various embodiments and with various modifications as are suited to the particular use contemplated. It is intended that the scope of the invention only be limited by the claims appended hereto.

I claim:

1. An apparatus for remotely controlling a potentiometer having a present resistance setting comprising:

means for varying a resistance setting of said potentiometer to a desired resistance setting and for generating at least one signal when said desired resistance setting is different from said present resistance setting of said potentiometer;

wherein said means for varying said resistance setting to said desired resistance setting comprises an encoder which generates a first encoder signal and a second encoder signal, said at least one signal including said first encoder signal and said second encoder signal;

a microprocessor;

change detecting means for detecting said at least one signal and for generating an interrupt signal, said change detecting means sending said interrupt signal to said microprocessor upon detection of said at least one signal;

wherein said change detecting means comprises logic means for detecting either a rising edge or a falling edge of said first encoder signal and for generating said interrupt signal upon detection of either said rising edge or said falling edge;

direction determining means responsive to said at least one signal for determining whether said desired resistance setting is greater in magnitude than said present resistance setting and for generating a direction signal indicative thereof;

wherein said microprocessor reads said direction signal upon receipt of said interrupt signal from said change detecting means and generates a resistance signal indicative of said desired resistance setting; and control means for receiving said resistance signal and for adjusting said potentiometer in accordance with said desired resistance setting.

2. An apparatus for remotely controlling a potentiometer as set forth in claim 1, wherein said logic means is comprised of a first flip-flop for detecting said rising edge and a second flip-flop for detecting said falling edge.

3. An apparatus for remotely controlling a potentiometer having a present resistance setting comprising:

means for varying a resistance setting of said potentiometer to a desired resistance setting and for generating at least one signal when said desired resistance setting different from said present resistance setting of said potentiometer;

wherein said means for varying said resistance setting to said desired resistance setting comprises an encoder which generates a first encoder signal and a second encoder signal, said at least one signal including said first encoder signal and said second encoder signal a microprocessor;

change detecting means for detecting said at least one signal and for generating an interrupt signal, said change detecting means sending said interrupt signal to said microprocessor upon detection of said at least one signal;

direction determining means responsive to said at least one signal for determining whether said desired resistance setting is greater in magnitude than said present resistance setting and for generating a direction signal indicative thereof;

wherein said direction signal generated by said direction determining means has a first logical level indicating a decrease in resistance if said first encoder signal leads said second encoder signal and said direction signal has a second logical level different from said first logical level indicating an increase in resistance, if said first encoder signal lags said second encoder signal;

wherein said microprocessor reads said direction signal upon receipt of said interrupt signal from said change detecting means and generates a resistance signal indicative of said desired resistance setting; and control means for receiving said resistance signal and for adjusting said potentiometer in accordance with said desired resistance setting.

4. An apparatus for remotely controlling a potentiometer as set forth in claim 3, wherein said direction determining means is comprised of a first flip-flop for detecting a rising edge of said first encoder signal, a second flip-flop for receiving said first encoder signal inverted for detecting a falling edge of said first encoder signal, a first AND gate having as inputs an output of said first flip-flop and said second encoder signal inverted, a second AND gate having as inputs an output of said second flip-flop and said second encoder signal, an OR gate receiving outputs of said first and second AND gates, and a third flip-flop receiving an output of said OR gate, and wherein said third flip-flop generates said direction signal to said microprocessor.

5. A method of remotely controlling a potentiometer having a present resistance setting comprising the steps of:
   a) varying a resistance setting of said potentiometer to a desired resistance setting;
   b) generating at least one signal when said desired a resistance setting is different from said present resistance setting of said potentiometer;
      wherein said step of generating at least one signal includes generating with an encoder a first encoder signal and a second encoder signal, said at least one signal including said first encoder signal and said second encoder signal
   c) detecting said at least one signal and generating an interrupt signal and sending said interrupt signal to a microprocessor upon detection of said at least one signal;
   d) determining whether said desired resistance is greater in magnitude than said present resistance setting and providing a direction signal indicative thereof to said microprocessor;
      wherein said step of determining whether said desired resistance setting is greater in magnitude than said current resistance setting and providing a direction signal indicative thereof to said microprocessor further comprises the steps of comparing said first encoder signal with said second encoder signal and generating a direction signal having a first logical level when said first encoder signal lags said second encoder signal and having a second logical level different from said first logical level when said first encoder signal leads said second encoder signal;
   e) generating with said microprocessor upon receiving said interrupt signal a resistance signal indicative of said desired resistance setting; and
   f) adjusting said potentiometer in accordance with said desired resistance setting generated with said microprocessor.

* * * * *